(12) United States Patent
Suda

(10) Patent No.: US 12,354,979 B2
(45) Date of Patent: Jul. 8, 2025

(54) HIGH FREQUENCY DEVICE

(71) Applicant: Sumitomo Electric Industries, Ltd., Osaka (JP)

(72) Inventor: Noriyoshi Suda, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 576 days.

(21) Appl. No.: 17/852,752

(22) Filed: Jun. 29, 2022

(65) Prior Publication Data

US 2023/0107075 A1 Apr. 6, 2023

(30) Foreign Application Priority Data

Oct. 5, 2021 (JP) ................................ 2021-164274

(51) Int. Cl.
*H01L 23/66* (2006.01)
*H03F 3/195* (2006.01)

(52) U.S. Cl.
CPC ............ *H01L 23/66* (2013.01); *H03F 3/195* (2013.01); *H01L 2223/6611* (2013.01); *H01L 2223/6655* (2013.01)

(58) Field of Classification Search
CPC ..... H01L 2223/6644; H01L 2223/6655; H01L 23/64; H01L 23/66
See application file for complete search history.

(56) References Cited

U.S. PATENT DOCUMENTS

| | | | |
|---|---|---|---|
| 6,043,111 A | 3/2000 | Furuse | |
| 9,087,840 B2 * | 7/2015 | Lin | H01L 23/66 |
| 2012/0325537 A1 | 12/2012 | Toyao et al. | |
| 2017/0034913 A1 * | 2/2017 | Mu | H05K 1/111 |
| 2018/0182705 A1 * | 6/2018 | Yin | H01L 23/66 |
| 2019/0393164 A1 * | 12/2019 | Lim | H01L 23/64 |
| 2021/0043573 A1 * | 2/2021 | Eid | H01L 25/18 |
| 2021/0126593 A1 * | 4/2021 | Roberts | H01L 23/66 |
| 2023/0197611 A1 * | 6/2023 | Romanczyk | H10D 30/47 257/734 |
| 2024/0162861 A1 * | 5/2024 | Kim | H01L 23/66 |

FOREIGN PATENT DOCUMENTS

| | | | |
|---|---|---|---|
| EP | 2477466 A2 * | 7/2012 | ....... H01L 23/49827 |
| JP | 10-050891 A | 2/1998 | |
| JP | 2009-224567 A | 10/2009 | |
| WO | 2011/070736 A1 | 6/2011 | |
| WO | 2011/111314 A1 | 9/2011 | |

* cited by examiner

*Primary Examiner* — Evren Seven
(74) *Attorney, Agent, or Firm* — Volpe Koenig

(57) ABSTRACT

A high frequency device includes a semiconductor chip including a semiconductor substrate, and an amplifier provided on a front surface of the semiconductor substrate and amplifying a high frequency signal, a first reference potential layer provided above the semiconductor chip in an upper direction perpendicular to the front surface of the semiconductor substrate, and provided so as to overlap with the semiconductor chip in a plan view from above, and to which a reference potential is supplied, and a resonator provided between the semiconductor chip and the first reference potential layer in the upper direction perpendicular to the front surface of the semiconductor substrate, wherein a resonance frequency of the resonator is included in an operating frequency band of the amplifier, and an impedance of the resonator becomes minimal at the resonance frequency.

9 Claims, 13 Drawing Sheets

HIGH FREQUENCY DEVICE

CROSS REFERENCE TO RELATED APPLICATIONS

This application claims priority based on Japanese Patent Application No. 2021-164274 filed on Oct. 5, 2021, and the entire contents of the Japanese patent applications are incorporated herein by reference.

FIELD

The present disclosure relates to a high frequency device, for example, a high frequency device having a semiconductor chip.

BACKGROUND

There has been known the high frequency device in which the semiconductor chip is mounted on a lead frame (for example, Japanese Laid-open Patent Publication No. 10-050891).

SUMMARY

A high frequency device according to the present disclosure includes: a semiconductor chip including a semiconductor substrate, and an amplifier provided on a front surface of the semiconductor substrate and amplifying a high frequency signal; a first reference potential layer provided above the semiconductor chip in an upper direction perpendicular to the front surface of the semiconductor substrate, and provided so as to overlap with the semiconductor chip in a plan view from above, and to which a reference potential is supplied; and a resonator provided between the semiconductor chip and the first reference potential layer in the upper direction perpendicular to the front surface of the semiconductor substrate, wherein a resonance frequency of the resonator is included in an operating frequency band of the amplifier, and an impedance of the resonator becomes minimal at the resonance frequency.

DETAILED DESCRIPTION OF EMBODIMENTS

Figure 1:
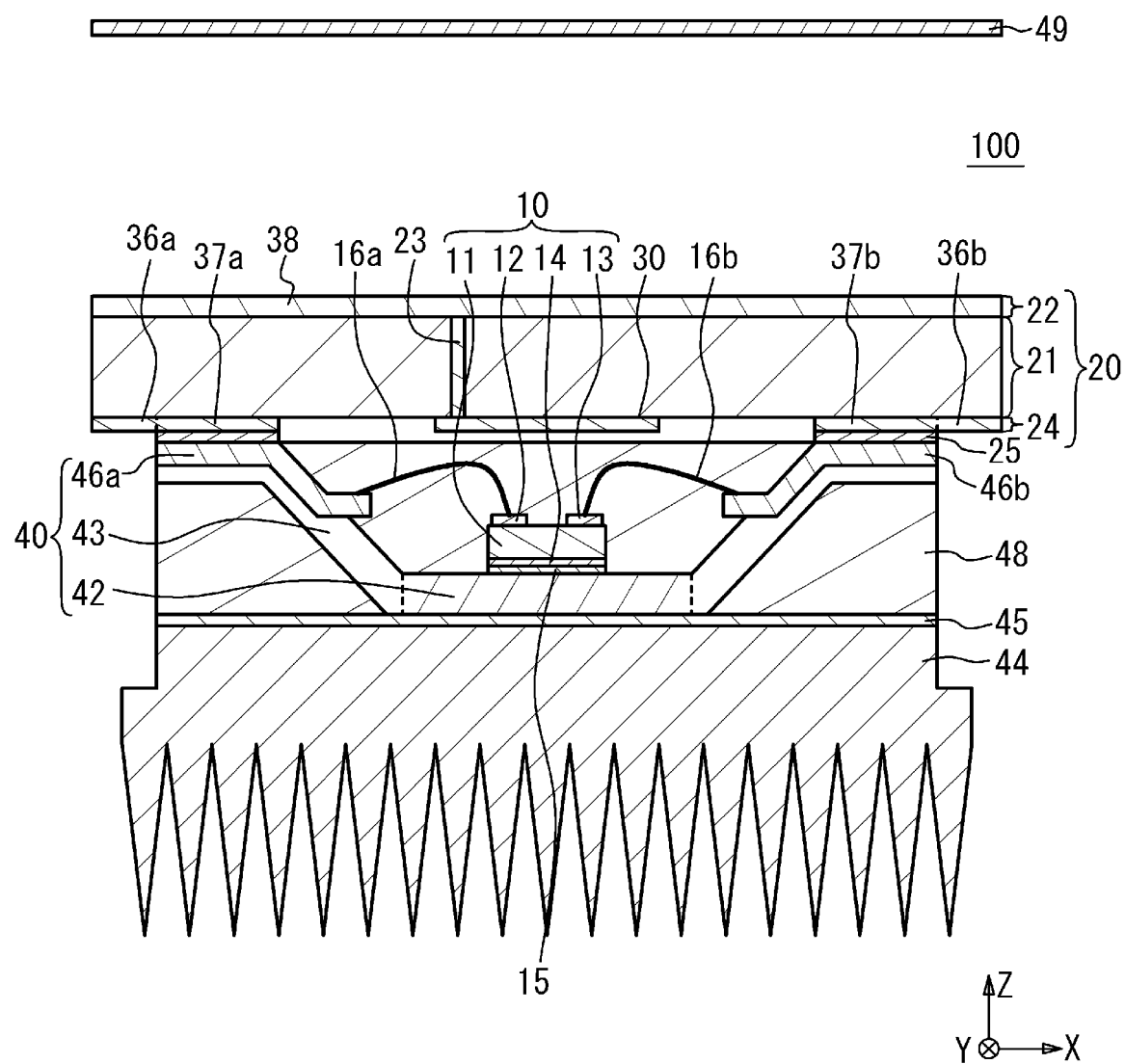
FIG. 1 is a cross-sectional view illustrating a high frequency device according to a first embodiment.

If a high frequency signal amplified by the semiconductor chip having at least a part of the amplifier leaks to the input of the semiconductor chip, the amplifier may oscillate.

The present disclosure has been made in view of the above problems, and an object of the present disclosure is to suppress the oscillation.

Description of Embodiments of the Present Disclosure

First, the contents of the embodiments of this disclosure are listed and explained.

(1) A high frequency device according to the present disclosure includes: a semiconductor chip including a semiconductor substrate, and an amplifier provided on a front surface of the semiconductor substrate and amplifying a high frequency signal; a first reference potential layer provided above the semiconductor chip in an upper direction perpendicular to the front surface of the semiconductor substrate, and provided so as to overlap with the semiconductor chip in a plan view from above, and to which a reference potential is supplied; and a resonator provided between the semiconductor chip and the first reference potential layer in the upper direction perpendicular to the front surface of the semiconductor substrate, wherein a resonance frequency of the resonator is included in an operating frequency band of the amplifier, and an impedance of the resonator becomes minimal at the resonance frequency. Thereby, the oscillation of the amplifier can be suppressed.

(2) At least a part of the resonator may overlap with at least a part of the semiconductor chip when viewed from above.

(3) The high frequency device further may include a substrate provided above the semiconductor chip and having a dielectric layer and a plurality of conductor layers that are laminated. The plurality of conductor layers may include the first reference potential layer, the resonator, and a signal line that transmits the high frequency signal input or output to the semiconductor chip.

(4) The resonator may include an electrode that forms a capacitance between the electrode and the first reference potential layer, and a line that has a first end connected to the electrode and a second end electrically connected to the first reference potential layer, surrounds the electrode, and forms an inductance.

(5) The high frequency device further may include a second reference potential layer provided between the first reference potential layer and the resonator and to which a reference potential is supplied. The resonator may include an electrode that forms a capacitance between the electrode and the second reference potential layer, and a line that has a first end connected to the electrode and a second end electrically connected to the second reference potential layer, surrounds the electrode, and forms an inductance.

(6) The resonator may include a distributed constant line having an electrical length longer than ⅛ and shorter than ⅜ of a wavelength of a signal at a center frequency of an operating frequency band of the amplifier, and having a first end connected to the reference potential and a second end being opened.

(7) The high frequency device further may include a lead frame having a base portion on which the semiconductor chip is mounted and that is connected to the semiconductor chip at a back surface side facing the front surface of the semiconductor substrate, and a signal lead portion electrically connected to an electrode provided on the front surface of the semiconductor substrate. The signal lead portion may be bonded to the signal line.

(8) The high frequency device further may include a bump provided on a front surface of the semiconductor chip and connecting the signal line to the semiconductor chip.

(9) The high frequency device further may include a heat dissipation member provided below the semiconductor chip.

Details of Embodiments of the Present Disclosure

Specific examples of a high frequency device in accordance with embodiments of the present disclosure are described below with reference to the drawings. The present disclosure is not limited to these examples, but is indicated by the claims, which are intended to include all modifications within the meaning and scope of the claims.

First Embodiment

Figure 2:
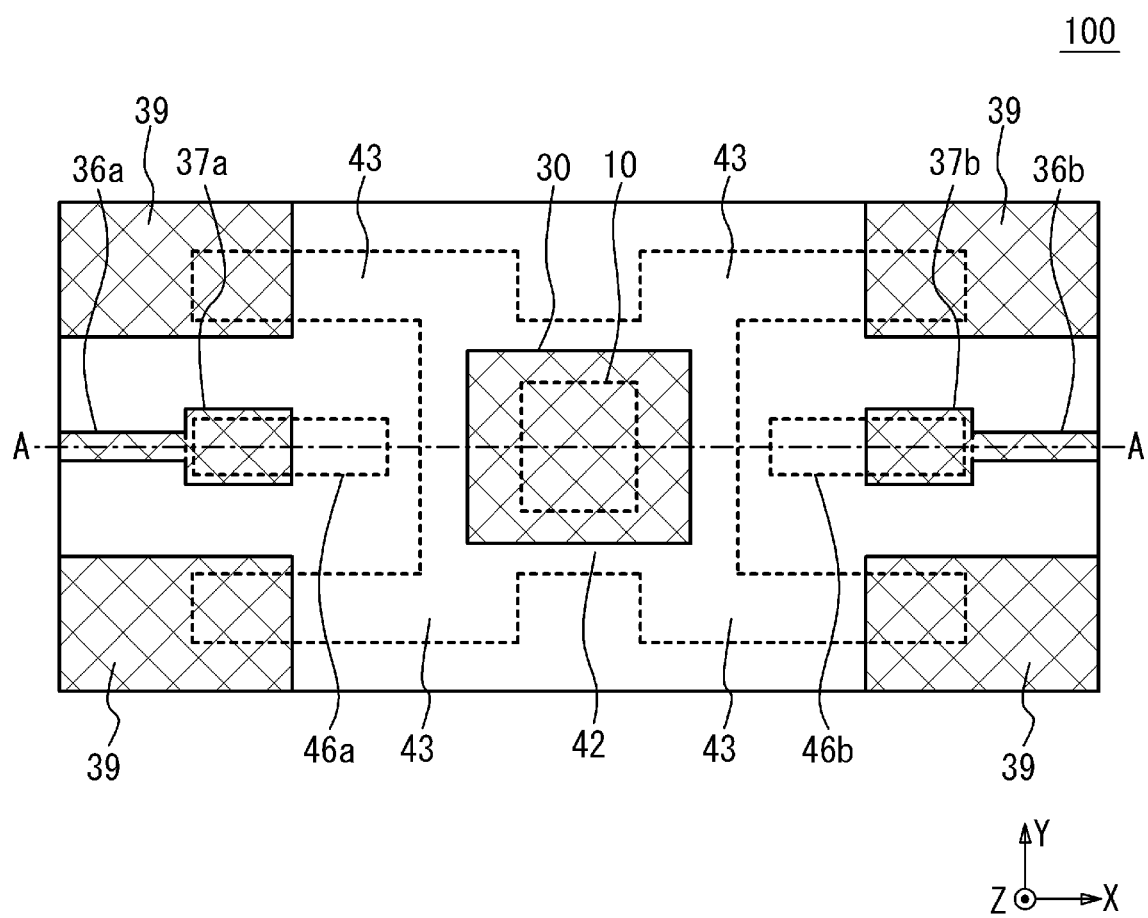
FIG. 2 is a plan view mainly illustrating a lower surface of a substrate viewed from above in the high frequency device according to the first embodiment.
Figure 3:
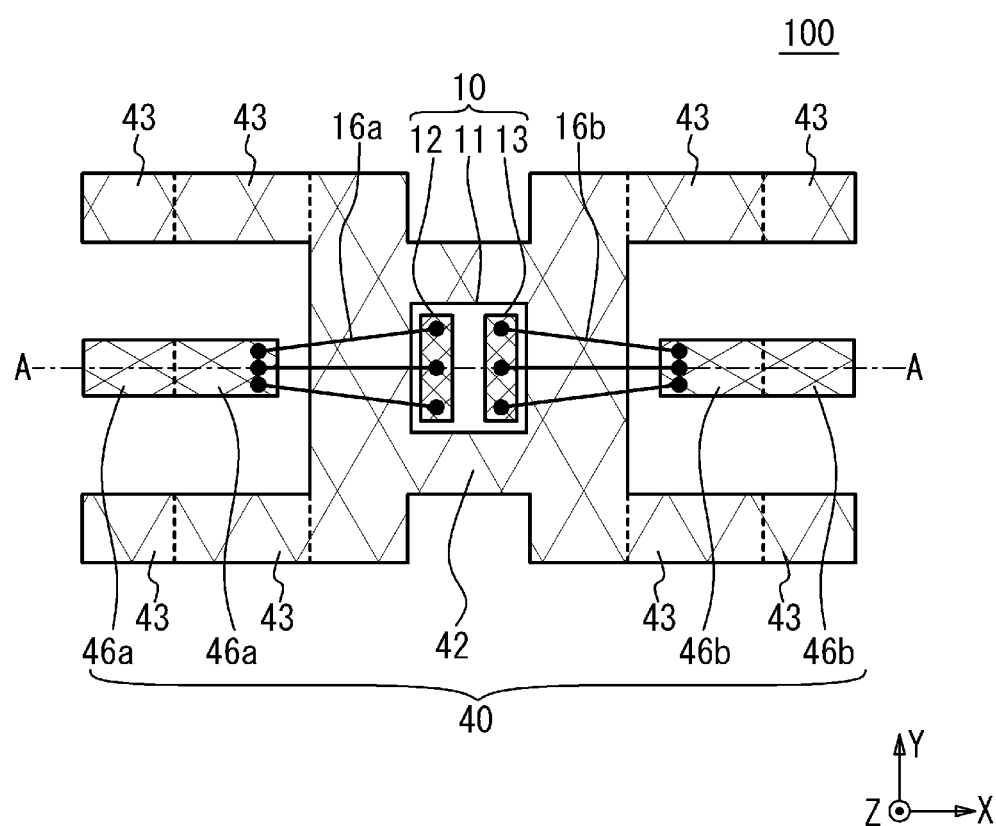
FIG. 3 is a plan view mainly illustrating an upper surface of a lead frame in the high frequency device according to the first embodiment.

FIG. 1 is a cross-sectional view illustrating a high frequency device according to a first embodiment. FIG. 2 is a plan view mainly illustrating a lower surface of a substrate viewed from above in the high frequency device according to the first embodiment. FIG. 3 is a plan view mainly illustrating an upper surface of a lead frame in the high frequency device according to the first embodiment. FIG. 1 corresponds to the A-A cross section of FIGS. 2 and 3. In FIG. 1, leads 43 at the back of leads 46a and 46b are illustrated in white. A stacking direction of a heat sink 44, a lead frame 40 and a substrate 20 is a Z direction, a direction from the signal line 36a to the signal line 36b is an X direction, and a direction orthogonal to the X direction and the Z direction is a Y direction.

As illustrated in FIGS. 1 to 3, in a high frequency device 100 of the first embodiment, a semiconductor chip 10 is mounted on a base 42 of the lead frame 40, and the substrate 20 is provided on the lead 43 of the lead frame 40. The semiconductor chip 10 has at least a part of an amplifier that amplifies the high frequency signal on the upper surface thereof, the high frequency signal is supplied from the substrate 20 to the semiconductor chip 10 via the leads 46a or 46b, and the high frequency signal amplified in the semiconductor chip 10 is output to the substrate 20 via the leads 46a or 46b. The heat sink 44 is provided below the semiconductor chip 10 via the base 42. The heat generated in the amplifier formed on the upper surface of the semiconductor chip 10 is dissipated from a lower surface of the semiconductor chip 10 to the heat sink 44 via the base 42. In this way, the electrical connection with the semiconductor chip 10 is performed from above, that is, toward the upper surface (+Z direction) of the semiconductor chip 10 when viewed from the cross section of the semiconductor chip 10 as illustrated in FIG. 1, and the heat dissipation from the semiconductor chip 10 is performed from below, that is, toward a lower surface (−Z direction) of the semiconductor chip 10 when viewed from the cross section of the semiconductor chip 10 as illustrated in FIG. 1. Above the substrate 20, which is further above the semiconductor chip 10, a conductor plate 49 forming a part of the housing on which a high frequency device 110 is mounted is provided. A reference potential is supplied to the conductor plate 49.

The lead frame 40 includes the base 42 and the leads 43, 46a and 46b. The lead 43 is connected to the base 42 and has the same potential as the base 42. The leads 46a and 46b are separated from the base 42. The lead frame 40 is a metal layer such as a copper layer. The semiconductor chip 10 is mounted on the base 42.

The semiconductor chip 10 includes a semiconductor substrate 11, electrodes 12 and 13 provided on the upper surface of the semiconductor substrate 11, and an electrode 14 formed on the lower surface of the semiconductor substrate 11. An amplifier is provided on the surface of the semiconductor substrate 11. When the amplifier included in the semiconductor chip 10 is a FET (Field Effect Transistor) such as, for example, a GaN-HEMT (Gallium Nitride High Electron Mobility Transistor), the electrodes 12, 13 and 14 are a gate electrode, a drain electrode and a source electrode, respectively, and the electrodes 12 and 13 are an input pad and an output pad, respectively. The electrodes 12, 13 and 14 are metal layers such as a gold layer. The electrode 14 is electrically connected to the base 42 by the bonding material 15 and is short-circuited. The bonding material 15 is conductive and is, for example, a brazing material such as a solder or a metal paste such as a silver paste.

The lead 46a and the electrode 12 are electrically connected to each other by a bonding wire 16a, and the lead 46b and the electrode 13 are electrically connected to each other by a bonding wire 16b. The bonding wires 16a and 16b are metal wires such as gold wires. The lead frame 40 and the semiconductor chip 10 are sealed by a sealing portion 48. The sealing portion 48 is an insulator such as an epoxy resin. The lower surfaces of the base 42 and the sealing portion 48 are bonded to the upper surface of the heat sink 44 by the bonding material 45. The bonding material 45 is made of a material having a high thermal conductivity, such as a heat conductive sheet. The heat sink 44 is made of a material having a high thermal conductivity such as copper.

The substrate 20 is, for example, a PCB (Printed Circuit Board), and includes a dielectric layer 21, a via wiring 23, and conductor layers 22 and 24. The dielectric layer 21 is a single layer or a multilayer, and is, for example, a resin layer or a ceramic layer such as FR-4 (Flame Retardant Type 4). The conductor layers 22 and 24 are provided on the upper surface and the lower surface of the dielectric layer 21, respectively. The via wiring 23 penetrates the dielectric layer 21. The via wiring 23, and the conductor layers 22 and 24 are metal layers such as a copper layer. The conductor layer 22 is provided on substantially the entire upper surface of the dielectric layer 21, and is a reference potential layer 38 to which a reference potential such as a ground potential is supplied. The conductor layer 24 forms a pattern 30 for resonator, signal lines 36a, 36b, pads 37a, 37b and patterns 39. A planar layout shape of the pattern 30 for resonator seems to overlap with a planar shape of the semiconductor chip 10 when viewed from the Z direction. A part of the pattern 30 for resonator is electrically connected to the reference potential layer 38 via the via wiring 23 and is short-circuited.

The signal lines 36a and 36b are connected to the pads 37a and 37b, respectively. The signal line 36a and the reference potential layer 38 form a microstrip line which is a transmission line, and the signal line 36b and the reference potential layer 38 form a microstrip line. The pads 37a and 37b are bonded to the leads 46a and 46b via the bonding material 25, respectively. The high frequency signal is transmitted to the electrode 12 of the semiconductor chip 10 via the signal line 36a, the pad 37a, the lead 46a, and the bonding wire 16a. The high frequency signal amplified by the semiconductor chip 10 and output to the electrode 13 is output via the bonding wire 16b, the lead 46b, the pad 37b, and the signal line 36b. The patterns 39 are bonded to the lead 43 by a bonding material. The pattern 39 are connected to the reference potential layer 38 and is short-circuited, so that the reference potential is supplied. The reference potential is supplied to the base 42 via the patterns 39 and the lead 43.

Figure 4A:
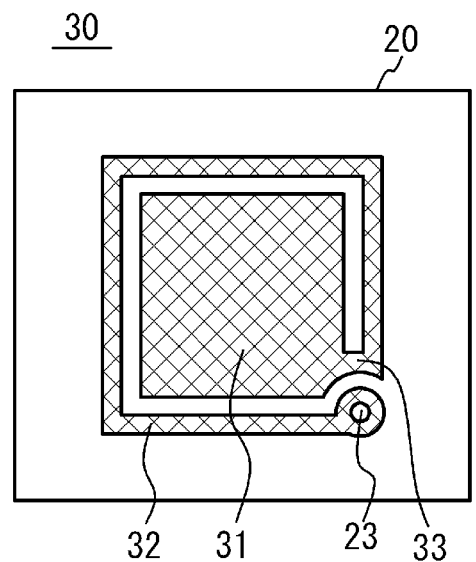
FIG. 4A is a plan view illustrating an example of a resonator in the first embodiment.

FIG. 4A is a plan view illustrating an example of the pattern for resonator in the first embodiment. As illustrated in FIG. 4A, the pattern 30 for resonator includes an electrode 31 and a line 32. The electrode 31 faces the reference potential layer 38 via the dielectric layer 21. The electrode 31 and the conductor layer 22 sandwiching the dielectric layer 21 form a capacitor. A first end of the line 32 is connected to the electrode 31 by a connecting portion 33. A second end of the line 32 is connected to the reference potential layer 38 via the via wiring 23. The line 32 forms an inductor laid out in a ring shape surrounding the electrode 31. Thereby, the capacitor and the inductor are connected in parallel between the electrode 31 and the reference potential layer 38. From a different point of view, the capacitor and the inductor are a ring-shaped series resonator in which the capacitor and the inductor are connected in series from the reference potential layer 38 to reach the reference potential layer 38, and function as a series resonator that resonates at the frequency of the high frequency signal. The series resonator configured by the pattern 30 for resonator has a minimal impedance at a resonance frequency.

Figure 4B:
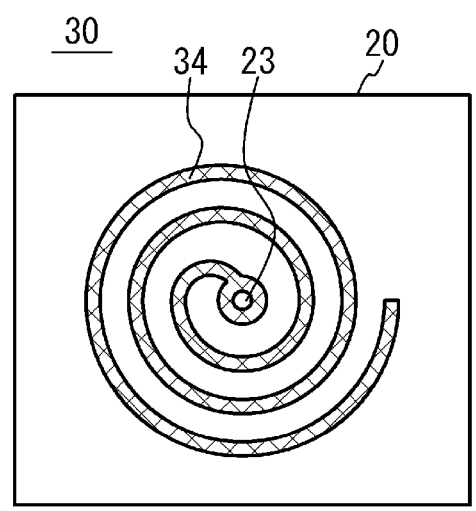
FIG. 4B is a plan view illustrating another example of a resonator in the first embodiment.

FIG. 4B is a plan view illustrating another example of the pattern for resonator in the first embodiment. As illustrated in FIG. 4B, the pattern 30 for resonator includes a distributed constant line 34 laid out in a spiral shape forming the microstrip line with the reference potential layer 38. A first end of the distributed constant line 34 is opened (that is, an opened state). A second end of the distributed constant line 34 is connected to the reference potential layer 38 via the via wiring 23. An electrical length of the distributed constant line 34 is about $\lambda/4$ when the wavelength of the high frequency signal amplified by the semiconductor chip 10 is k. The wavelength k is a wavelength of the dielectric layer 21. Thereby, the distributed constant line 34 functions as a series resonator that resonates at the frequency of the high frequency signal. The resonator configured by the pattern 30 for resonator has a minimal impedance at the resonance frequency. A part of the high frequency signal amplified by the semiconductor chip 10 is radiated into a space. The resonator configured by the pattern 30 for resonator attenuates a part of the radiated high frequency signal. Details will be described later. An example in which the planar shape of the pattern 30 for resonator is substantially square or circular is described, but the planar shape of the pattern 30 for resonator can be freely set to be rectangular, polygonal, oval, or the like.

First Comparative Example

Figure 5:
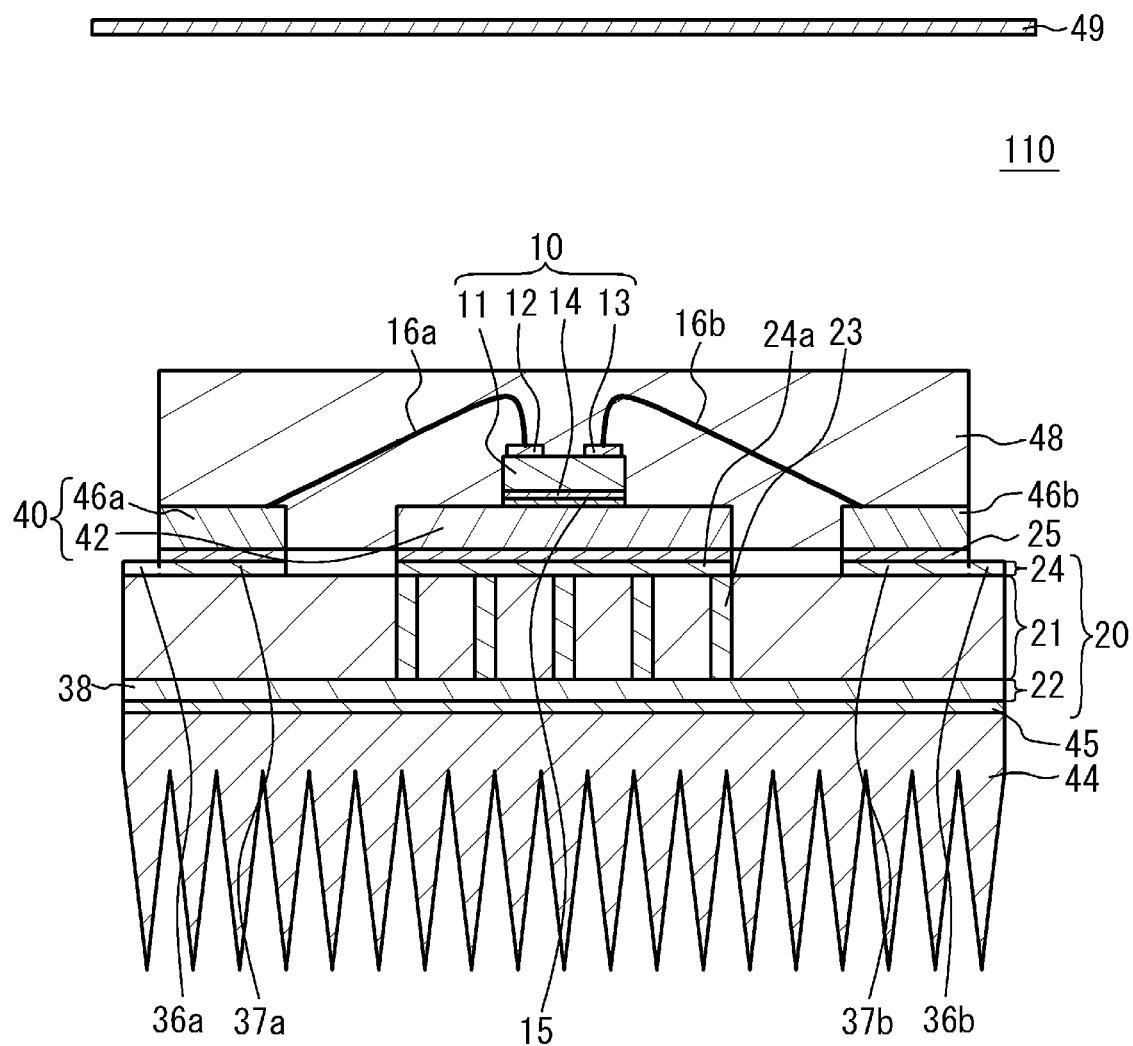
FIG. 5 is a cross-sectional view illustrating a high frequency device according to a first comparative example.

FIG. 5 is a cross-sectional view illustrating a high frequency device according to a first comparative example. As illustrated in FIG. 5, in the high frequency device 110 according to the first comparative example, the semiconductor chip 10 is mounted on the lead frame 40, and the substrate 20 is provided under the lead frame 40. The heat sink 44 is provided under the substrate 20. In the first comparative example, the substrate 20 for handling, outside the semiconductor chip 10, the high frequency signal input to the semiconductor chip 10, the high frequency signal output from the semiconductor chip 10, and an electrical signal such as a reference potential supplied to the semiconductor chip 10 is located below the semiconductor chip 10. Further, heat dissipation from the lower surface of the semiconductor chip 10 is also performed from the heat sink 44 via the substrate 20, that is, similarly from below the semiconductor chip 10. In this way, the electrical connection with the semiconductor chip 10 is performed from below, that is, toward the lower surface (–Z direction) of the semiconductor chip 10 when viewed from the cross section of the semiconductor chip 10 as illustrated in FIG. 5, and the heat dissipation from the semiconductor chip 10 is also performed from below, that is, toward the lower surface (–Z direction) of the semiconductor chip 10 when viewed from the cross section of the semiconductor chip 10 as illustrated in FIG. 5.

The semiconductor chip 10 is mounted on the base 42 in the lead frame 40. The leads 46a and 46b are electrically connected to the electrodes 12 and 13 via bonding wires 16a and 16b, respectively. The lead frame 40 and the semiconductor chip 10 are sealed by the sealing portion 48. In the substrate 20, the conductor layer 22 forming the reference potential layer 38 is provided on the lower surface of the dielectric layer 21, and the conductor layer 24 is provided on the upper surface of the dielectric layer 21. The conductor layer 24 includes signal lines 36a and 36b, pads 37a and 37b, and a pattern 24a.

The pads 37a and 37b and the pattern 24a are connected to the leads 46a and 46b and the base 42 of the lead frame 40 by the bonding material 25. The pattern 24a is connected to the reference potential layer 38 by a plurality of via wirings 23. The reference potential layer 38 is bonded to the heat sink 44 via the bonding material 45.

In the first comparative example, a distance between the semiconductor chip 10 and the conductor plate 49 forming a part of the housing on which the high frequency device 110 is mounted is long. Therefore, even if a part of the high frequency signal amplified by the semiconductor chip 10 is radiated into the space, the signal reflected by the conductor plate 49 and returned to an input side of the semiconductor chip 10 is very small. This makes it unlikely that the amplifier including the semiconductor chip 10 will oscillate. However, the heat generated in the semiconductor chip 10 is dissipated to the heat sink 44 via the base 42, the pattern 24a, the via wiring 23, and the conductor layer 22. As described above, since the heat dissipation path is long, the heat dissipation is inferior.

Second Comparative Example

Figure 6:
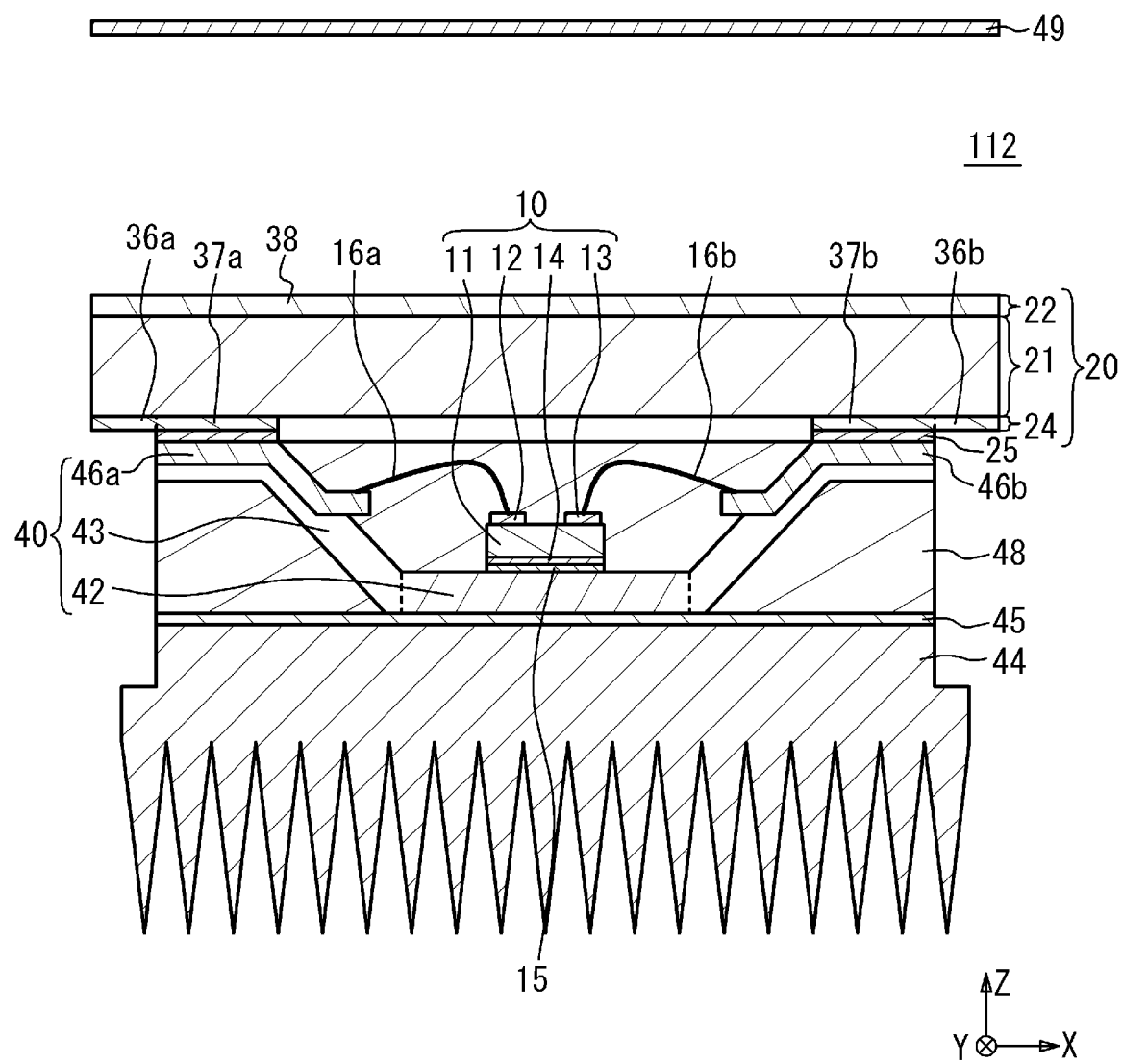
FIG. 6 is a cross-sectional view illustrating a high frequency device according to a second comparative example.

FIG. 6 is a cross-sectional view illustrating a high frequency device according to a second comparative example. As illustrated in FIG. 6, in a high frequency device 112 according to the second comparative example, the electrical connection with the semiconductor chip 10 is performed from above, and the heat radiation from the semiconductor chip 10 is performed from below. The electrical connection with the semiconductor chip 10 is performed from above, that is, toward the upper surface (+Z direction) of the semiconductor chip 10 when viewed from the cross section of the semiconductor chip 10 as illustrated in FIG. 6, and the heat radiation from the semiconductor chip 10 is performed from below, that is, toward the lower surface (−Z direction) of the semiconductor chip 10 when viewed from the cross section of the semiconductor chip 10 as illustrated in FIG. 6. Thereby, since the heat sink 44 is bonded to the base 42, the heat dissipation path from the semiconductor chip 10 to the heat sink 44 becomes short, and hence the heat dissipation of the second comparative example is better than that of the first comparative example. However, the reference potential layer 38 to which the reference potential is supplied is located on the upper surface of the substrate 20. The reference potential layer 38 is provided to form the transmission line such as a microstrip line in the substrate 20.

Figure 7:
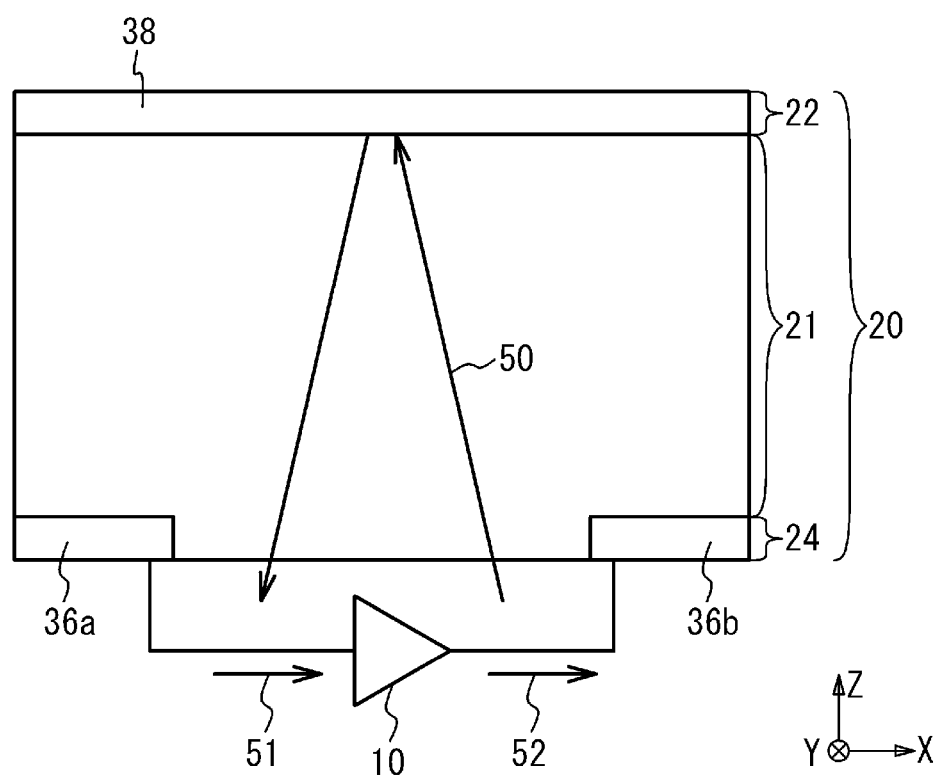
FIG. 7 is a schematic diagram illustrating the high frequency device according to the second comparative example.

FIG. 7 is a schematic diagram illustrating the high frequency device 112 according to the second comparative example. FIG. 7 schematically illustrates the substrate 20 and the semiconductor chip 10. As illustrated in FIG. 7, the semiconductor chip 10 amplifies an input high frequency signal 51 and outputs an amplified high frequency signal 52. A part 50 of the amplified high frequency signal is radiated into the space. The thickness of the dielectric layer 21 is, for example, 3 mm or less. Therefore, the part 50 of the high frequency signal radiated into the space reaches the reference potential layer 38 without significantly attenuating its amplitude. After that, the part 50 of the high frequency signal is reflected by the reference potential layer 38, input to the input side of the semiconductor chip 10, and further amplified inside the semiconductor chip 10 to perform positive feedback of the signal. This will likely cause the amplifier including the semiconductor chip 10 to oscillate.

Third Comparative Example

Figure 8:
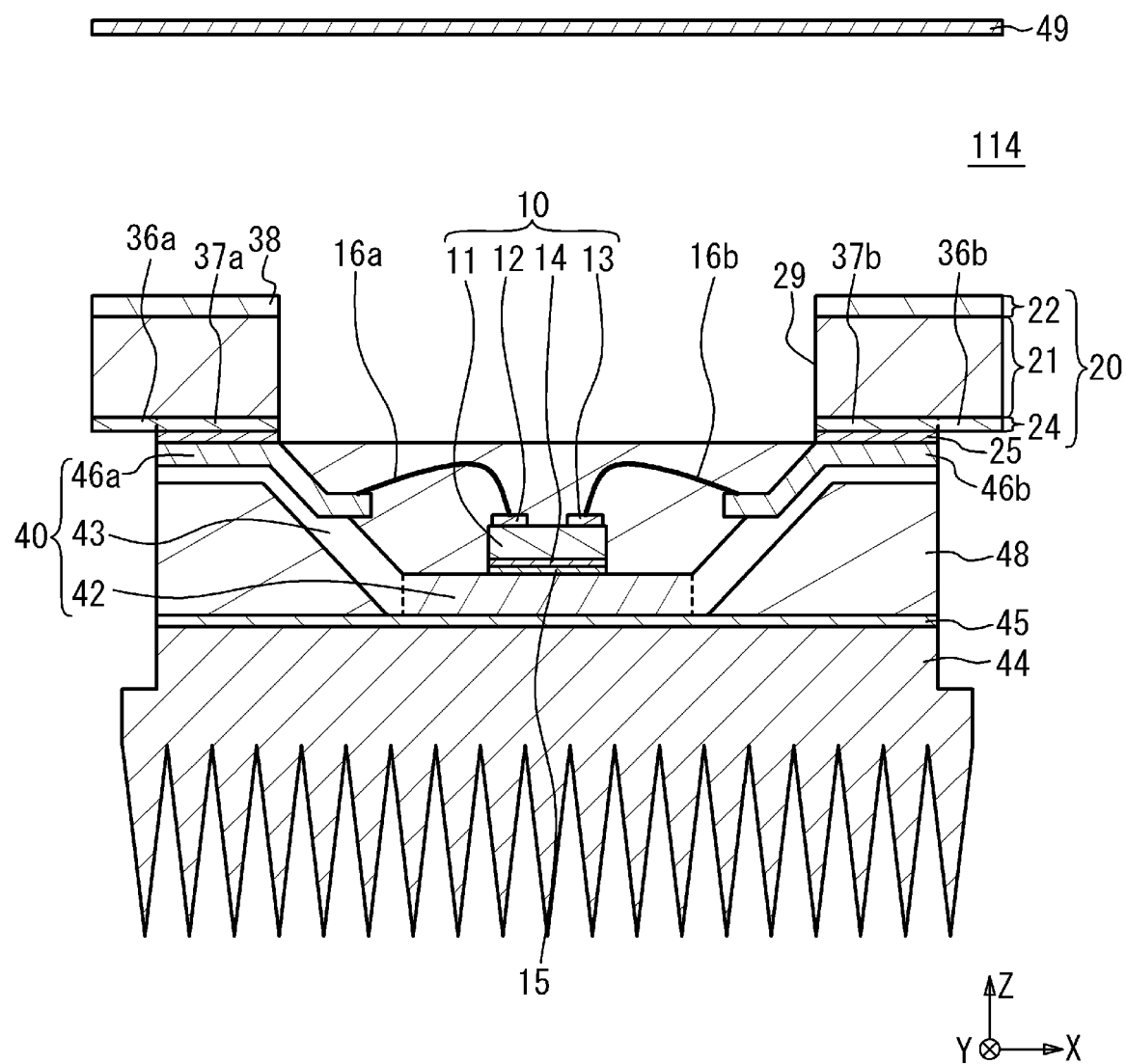
FIG. 8 is a cross-sectional view illustrating a high frequency device according to a third comparative example.

FIG. 8 is a cross-sectional view illustrating a high frequency device 114 according to a third comparative example. As illustrated in FIG. 8, in the high frequency device 114 according to the third comparative example, the substrate 20 has an opening 29. The opening 29 is located above the semiconductor chip 10. Since the conductor layer 22 serving as the reference potential layer is not provided above the semiconductor chip 10, a part of the high frequency signal radiated into the space is not reflected by the reference potential layer 38, and hence the oscillation of the amplifier is unlikely to occur. However, when the conductor plate 49 forming the part of the housing of the high frequency device 114 is provided in the vicinity of the high frequency device 114, the part of the high frequency signal radiated in the space is reflected by the conductor plate 49, and the amplifier may oscillate as in the second comparative example. In this way, the characteristics of the amplifier change depending on the environment in which the high frequency device 114 is installed. Since the transmission lines and the like cannot be formed in the opening 29, a problem may occur in terms of the degree of freedom in designing the high frequency device.

Principle of First Embodiment

Figure 9:
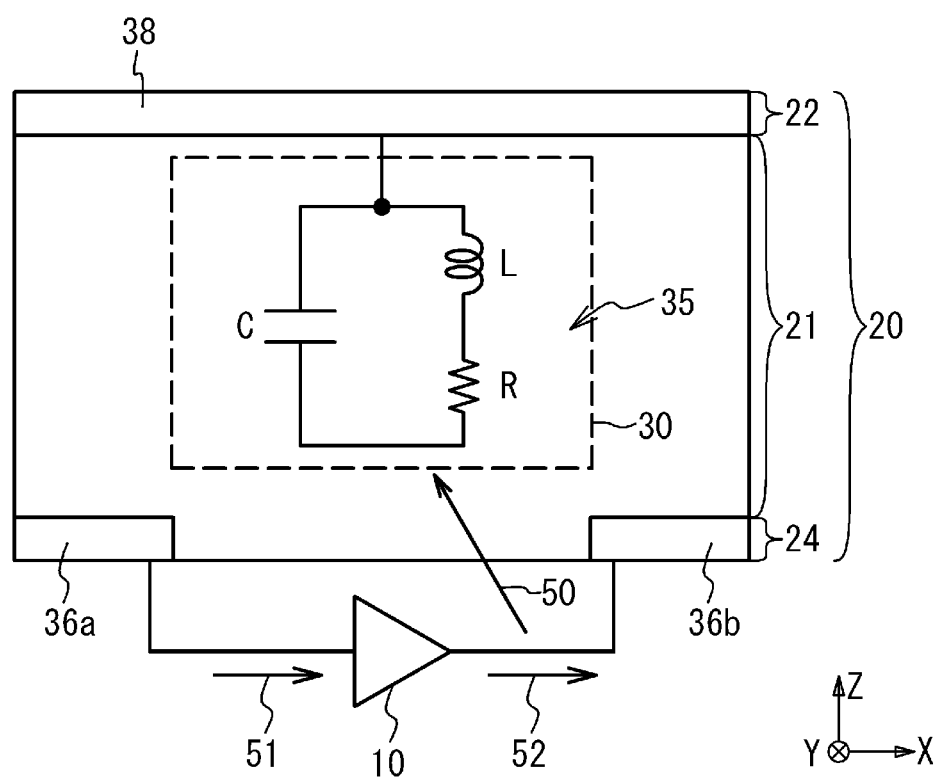
FIG. 9 is a schematic diagram illustrating the high frequency device according to the first embodiment.

FIG. 9 is a schematic diagram illustrating the high frequency device 100 according to the first embodiment. FIG. 9 schematically illustrates the substrate 20 and the semiconductor chip 10 from a direction of a side surface of the high frequency device 100. As illustrated in FIG. 9, in the first embodiment, the pattern 30 for resonator is provided on the substrate 20. The pattern 30 for resonator operates as a series resonator 35 in which the capacitor C and the inductor L are connected in series when the part 50 of the amplified high frequency signal radiated into the space is irradiated to the pattern 30. The resistance R is a parasitic resistance, but a resistance element may be added. The pattern 30 for resonator is designed so that the resonance frequency of the series resonator 35 is at or near the frequencies of the high frequency signals 51 and 52. Therefore, when the part 50 of the amplified high frequency signal is radiated into the space and irradiated to the pattern 30 for resonator, the pattern 30 for resonator operates as the series resonator 35, and an impedance becomes minimal at a resonance frequency of the series resonator 35. Therefore, the part 50 of the high frequency signal radiated into the space is attenuated by the resistance R during resonance. Thereby, the part 50 of the high frequency signal radiated into the space is absorbed by the pattern 30 for resonator and does not reach the reference potential layer 38 located further above. Alternatively, the part 50 of the high frequency signal radiated into the space is reflected by the reference potential layer 38 and is not input to the input side of the semiconductor chip 10. Therefore, the positive feedback as in the second comparative example is suppressed, and the oscillation of the amplifier including the semiconductor chip 10 can be suppressed. Further, even if the conductor plate 49 is provided in the vicinity of the high frequency device, it is not easily affected by the conductor plate 49 because the reference potential layer 38 is provided. Therefore, the characteristics of the high frequency device can be made constant regardless of the environment in which the high frequency device is installed.

The pattern 30 for resonator is not connected to any power source, and a current flows due to a self-induced electromotive force generated by the change of the magnetic flux passing through the inside of the coil of the coiled inductor by the high frequency signal irradiated from the outside. Since the pattern 30 for resonator can be regarded as the series resonator 35, the closer the frequency of the irradiated high frequency signal is to the resonance frequency of the series resonator 35, the smaller the impedance of the pattern 30 for resonator becomes, and the impedance becomes minimum at the resonance frequency. As a result, the closer the frequency of the irradiated high frequency signal is to the resonance frequency of the series resonator 35, the larger the current flowing through the pattern 30 for resonator. Energy is not consumed in the capacitor C and the inductor L constituting the pattern 30 for resonator, and the energy of the high frequency signal irradiated from the outside is attenuated and consumed only in the resistance R which is the parasitic resistance. As long as the pattern 30 for resonator does not prevent the self-induced electromotive force from being generated by the high frequency signal irradiated from the outside, the resistance R may not only be the parasitic resistance but also add the resistance element from the outside. When the pattern 30 for resonator generates the self-induced electromotive force by the high frequency signal irradiated from the outside and the current flows, the larger the resistance value of the resistance R, the larger the consumed energy.

In the second comparative example, the reference potential layer 38 (first reference potential layer) to which the reference potential is supplied is provided above the semiconductor chip 10 in an upper direction (Z direction) perpendicular to the surface (front surface) of the semiconductor substrate 11, and provided so as to overlap with the semiconductor chip 10 in a plan view from above. This causes the oscillation in the amplifier including the semiconductor chip 10, as illustrated in FIG. 7. Therefore, according to the first embodiment, as illustrated in FIG. 9, the series resonator 35 (resonator) is provided between the semiconductor chip 10 and the reference potential layer 38 in the upper direction (Z direction) perpendicular to the surface of the semiconductor substrate 11.

The amplifier has an operating frequency band $\Delta f$ that can be amplified. A center frequency fo of the operating frequency band $\Delta f$ is, for example, 0.5 GHz to 10 GHz. The operating frequency band $\Delta f$ is, for example, 0.05×fo to 0.2×fo. For example, the center frequency fo is 2 GHz to 4 GHz, and the operating frequency band $\Delta f$ is 0.2 GHz to 0.4 GHz. Since the series resonator 35 absorbs the high frequency signal in the operating frequency band $\Delta f$, the resonance frequency of the series resonator 35 is included in the operating frequency band $\Delta f$, i.e., within the range of fo±$\Delta f$/2. The resonance frequency of the series resonator 35 is preferably located within the range of fo±2×$\Delta f$/5, and more preferably located within the range of fo±$\Delta f$/4. When the impedance of the series resonator 35 becomes minimal at the resonance frequency, the part 50 of the high frequency signal is reflected by the series resonator 35. Therefore, the impedance of the series resonator 35 is minimal at the resonant frequency of the series resonator 35. As described above, the part 50 of the high frequency signal is absorbed by the pattern 30 for resonator. Therefore, the oscillation of the amplifier can be suppressed.

When viewed from above, the pattern 30 for resonator may be provided in the vicinity of the semiconductor chip 10. As illustrated in FIG. 7, the part 50 of the high frequency signal that positively returns to the input side of the semiconductor chip 10 passes directly above the semiconductor chip 10. Therefore, when viewed from above, it is preferable that at least a part of the series resonator 35 overlaps with at least a part of the semiconductor chip 10. This can suppress the positive feedback of the part 50 of the high frequency signal to the input side of the semiconductor chip 10. Thus, oscillation of the amplifier can be more suppressed.

The substrate 20 is provided above the semiconductor chip 10, and the dielectric layer 21 and the plurality of conductor layers 22 and 24 are laminated in the substrate 20. The conductor layer 24 includes signal lines 36a and 36b for transmitting high frequency signals input or output to the semiconductor chip 10. The conductor layer 22 includes the reference potential layer 38 of the signal lines 36a and 36b. In this way, the substrate 20 is electrically connected to the semiconductor chip 10 from above. In this case, the reference potential layer 38 is provided near and above the semiconductor chip 10. Therefore, the part 50 of the high frequency signal is reflected by the conductor layer 22, and the oscillation of the amplifier is likely to occur. Therefore, it is preferable to provide the pattern 30 for resonator by the conductor layer 24 in the substrate 20. The pattern 30 for resonator is formed by the conductor layer 24, so that the pattern 30 for resonator can be made smaller.

Although the example in which the signal lines 36a, 36b and the pattern 30 for resonator are formed by the conductor layer 24 provided on the lower surface of the substrate 20 is described, at least one of the signal lines 36a and 36b and the pattern 30 for resonator may be formed by a conductor layer which is an inner layer of the substrate 20. Although the example in which the reference potential layer 38 is formed by the conductor layer 22 provided on the upper surface of the substrate 20 is described, the reference potential layer 38 may be formed by the conductor layer which is the inner layer of the substrate 20.

As illustrated in FIG. 4A, the pattern 30 for resonator includes the electrode 31 that forms the capacitance between the electrode 31 and the reference potential layer 38, and the line 32 that has a first end connected to the electrode 31 and a second end electrically connected to the reference potential layer 38, surrounds the electrode 31 and forms the inductance. This makes it possible to form the series resonant circuit.

As illustrated in FIG. 4B, the pattern 30 for resonator includes the distributed constant line 34 having the electrical length of about ¼ of the wavelength $\lambda$ (that is, a length of one cycle) at the center frequency fo of the operating frequency band $\Delta f$ of the amplifier, and having a first end connected to the reference potential and a second end being opened. This makes it possible to form the pattern 30 for resonator. When the electrical length of the distributed constant line 34 is longer than $\lambda/8$ and shorter than $3\lambda/8$, the distributed constant line 34 functions as the resonator that obtains attenuation at the frequency fo. The electrical length of the distributed constant line 34 is preferably longer than $3\lambda/16$ and shorter than $5\lambda/16$.

The lead frame 40 has the base 42 (base portion) on which the semiconductor chip 10 is mounted and that is connected to the semiconductor chip 10 at a back surface side (a back surface facing a front surface) of the semiconductor substrate 11, and the leads 46a and 46b (a signal lead portion) electrically connected to electrodes provided on the upper surface of the semiconductor substrate 11. The leads 46a and 46b are bonded to the signal lines 36a and 36b. Thereby, the semiconductor chip 10 and the substrate 20 can be electrically connected to each other. A chip other than the semiconductor chip 10 such as a matching circuit can be mounted on the base 42 of the lead frame 40.

The substrate 20 is provided above the semiconductor substrate 11, and the heat sink 44 (that is, a heat dissipation member) is provided below the semiconductor chip 10. This can improve the heat dissipation because heat is not dissipated through the substrate 20 as in the first comparative example.

First Variation of First Embodiment

Figure 10:
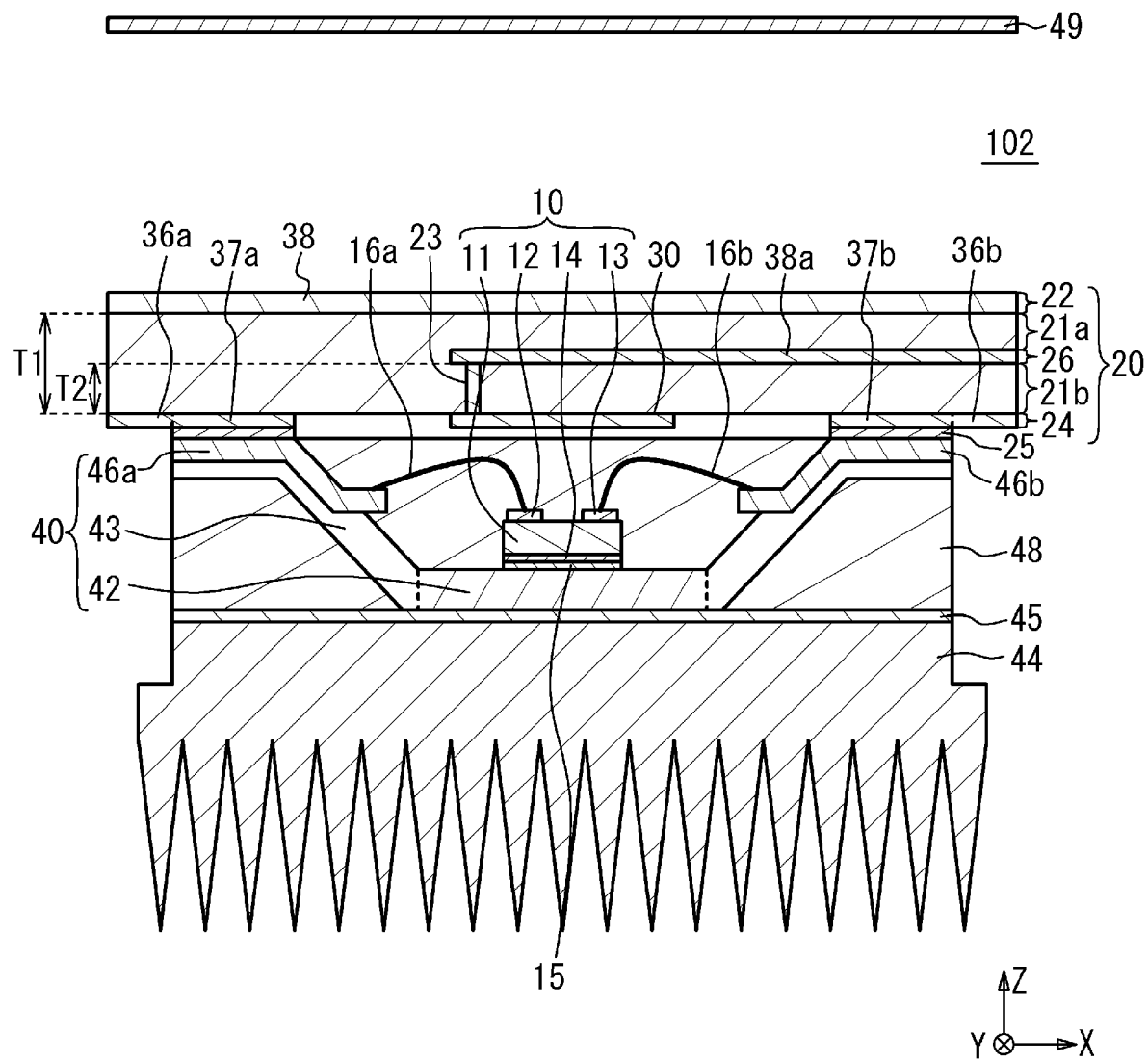
FIG. 10 is a cross-sectional view illustrating a high frequency device according to a first variation of the first embodiment.

FIG. 10 is a cross-sectional view illustrating a high frequency device according to a first variation of the first embodiment. As illustrated in FIG. 10, in a high frequency device 102, the substrate 20 includes laminated dielectric layers 21a and 21b. A conductor layer 26 is provided between the dielectric layers 21a and 21b. The conductor layer 26 forms a reference potential layer 38a to which the reference potential such as a ground is supplied. The pattern 30 for resonator is connected to the reference potential layer 38a via the via wiring 23. The reference potential layer 38a may be electrically connected to the reference potential layer 38 via the via wiring or the like and may be short-circuited. Different reference potentials may be supplied to the reference potential layers 38 and 38a, respectively. Other configurations are the same as those in the first embodiment, and the description thereof will be omitted.

When the microstrip line is formed by the signal lines 36a and 36b and the reference potential layer 38, the characteristic impedance of the microstrip line is determined by a permittivity of the dielectric layer 21, widths of the signal lines 36a and 36b, and a distance T1 between the signal lines 36a and 36b and the reference potential layer 38. When the power of the high frequency signal is large, it is required to increase the width of the signal lines 36a and 36b so that a current density of the current flowing through the signal lines 36a and 36b is equal to or less than a specified value. As an example, when the power of the high frequency signal amplified by the semiconductor chip 10 is 50 W and the frequency is 2 to 3 GHz, the width of the signal line 36b is 1 mm or more. When the relative permittivity of the dielectric layer 21 is about 5, and the characteristic impedance is 50Ω, the distance T1 is 0.5 mm or more. The capacitance in the pattern 30 for resonator is determined by the resonance frequency of the pattern 30 for resonator. When an area of the electrode 31 in FIG. 4A is to be about 10 mm$^2$, a distance T2 between the pattern 30 for resonator and the reference potential layer 38a is preferably about 0.1 mm. In this way, it may be preferable to set the distances T1 and T2 to different values.

According to the first variation of the first embodiment, the reference potential layer 38a (second reference potential layer) to which the reference potential is supplied is provided between the reference potential layer 38 and the pattern 30 for resonator. The pattern 30 for resonator includes an electrode that forms the capacitance between the reference potential layer 38a and the electrode, and a line that forms an inductance and has a first end connected to the electrode and a second end connected to the reference potential layer 38a. Thereby, the transmission line formed by the signal lines 36a and 36b and the reference potential layer 38, and the capacitance can be set independently. Even in the resonator having the distributed constant line 34 laid out in the spiral shape as illustrated in FIG. 4B, the reference potential layer 38a may be provided separately from the reference potential layer 38.

Second Variation of First Embodiment

Figure 11:
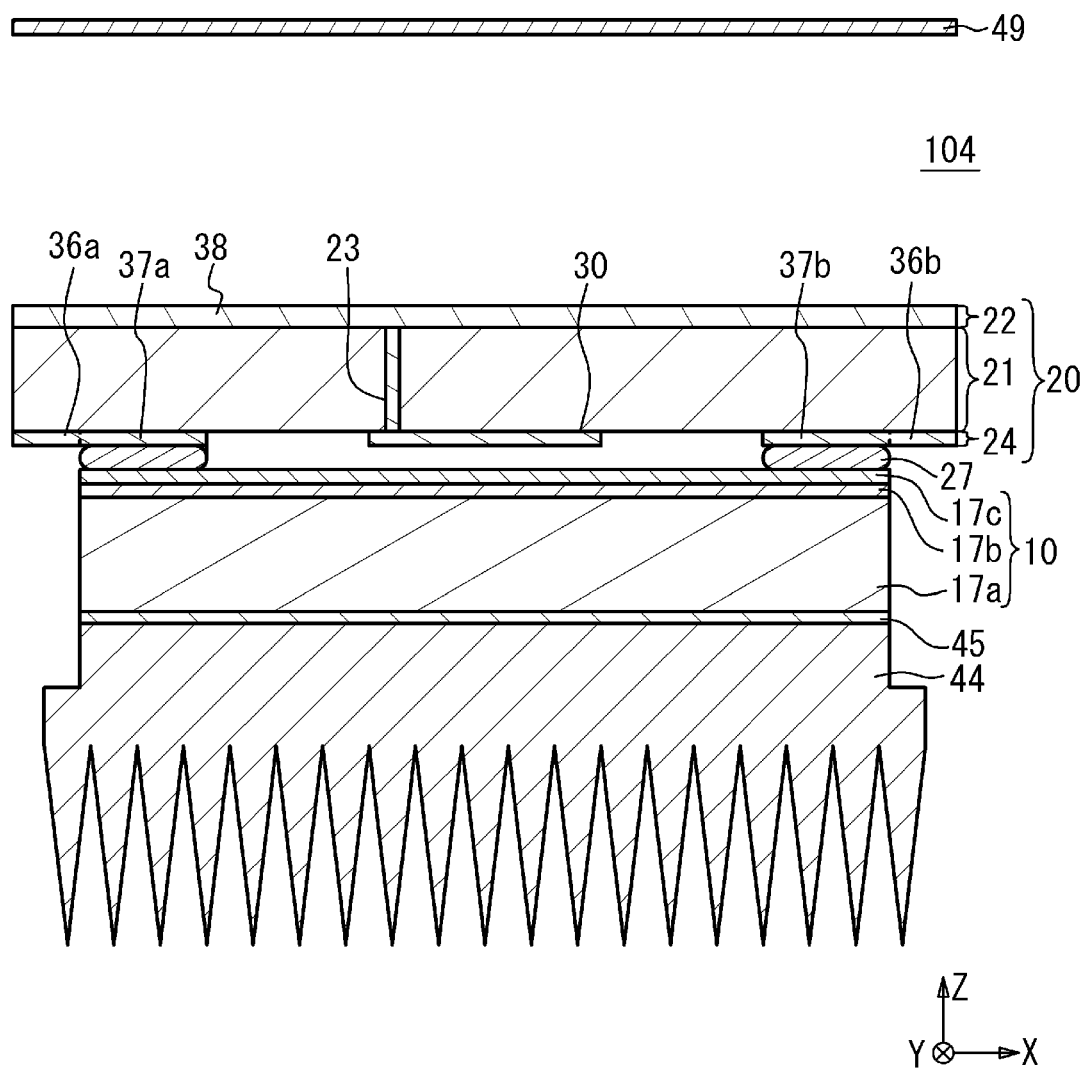
FIG. 11 is a cross-sectional view illustrating a high frequency device according to a second variation of the first embodiment.

FIG. 11 is a cross-sectional view illustrating a high frequency device according to a second variation of the first embodiment. As illustrated in FIG. 11, in a high frequency device 104, the lead frame 40 is not provided, and the semiconductor chip 10 is flip-chip mounted on the substrate 20 by bumps 27 and the like. The bump 27 is, for example, a solder or a copper pillar. The semiconductor chip 10 is bonded to the heat sink 44 by the bonding material 45. The semiconductor chip 10 includes a substrate 17a, an active layer 17b, and a wiring layer 17c. A surface of the substrate 17a on which the active layer 17b is located is a front surface of the semiconductor chip 10, and the amplifier is formed on the front surface. A surface of the substrate 17a opposite to the surface on which the active layer 17b is located is a back surface of the semiconductor chip 10. The amplifier includes, for example, GaN-HEMT. In the case of GaN-HEMT, the substrate 17a is, for example, a SiC substrate, a sapphire substrate, a silicon substrate, or a GaN substrate. The active layer 17b is, for example, a GaN channel and an AlGaN barrier layer, and an active element such as GaN-HEMT is formed in the active layer 17b. The wiring layer 17c rearranges each electrode of GaN-HEMT. In the case of MMIC (Monolithic Microwave Integrated Circuit), a matching circuit including a capacitor and an inductor may be provided in the wiring layer 17c. The lead frame or the like may be provided as a heat spreader between the semiconductor chip 10 and the heat sink 44. Other configurations are the same as those in the first embodiment, and the description thereof will be omitted.

The bump 27 is provided on the front surface of the semiconductor chip 10 and connects the signal lines 36a and 36b to the semiconductor chip 10, as in the second variation of the first embodiment. Thereby, the semiconductor chip 10 and the substrate 20 can be electrically connected to each other. The semiconductor chip 10 can be bonded to the heat sink 44 without via the lead frame 40. Thereby, the heat dissipation can be improved.

Second Embodiment

Figure 12:
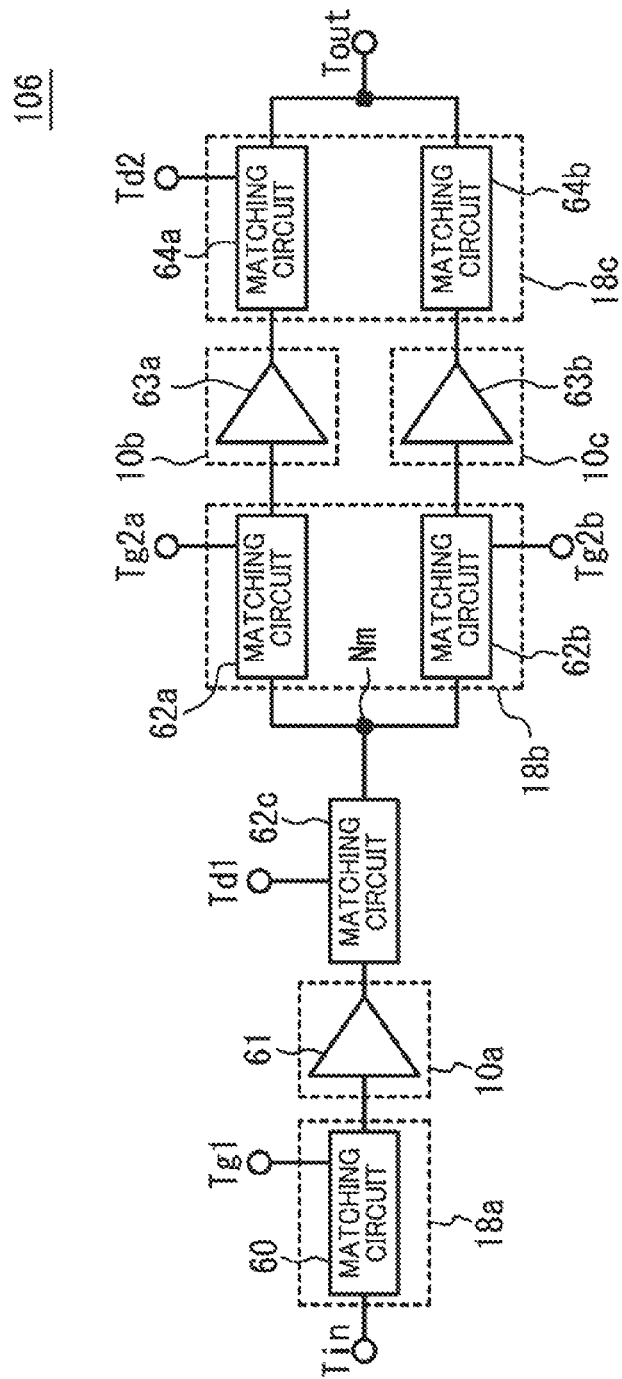
FIG. 12 is a block diagram illustrating a high frequency device according to a second embodiment.

The second embodiment illustrates an example of a high frequency power amplification device used in a base station as the high frequency device. FIG. 12 is a block diagram illustrating a high frequency device according to a second embodiment. As illustrated in the second embodiment, a high frequency device 106 includes amplifiers 61, 63a and 63b and matching circuits 60, 62a, 62b, 62c, 64a and 64b. The high frequency device 106 is a two-stage amplification device. The high frequency signal input from an input terminal Tin is amplified by the amplifier 61, further amplified by the amplifiers 63a and 63b, and output from an output terminal Tout. The matching circuit 60 is mounted on a chip 18a, the matching circuits 62a and 62b are mounted on a chip 18b, and the matching circuits 64a and 64b are mounted on a chip 18c. The amplifiers 61, 63a and 63b are, for example, transistors such as FETs (Field Effect Transistors), and are mounted on the semiconductor chips 10a to 10c, respectively.

The input terminal Tin is connected to the amplifier 61 via the matching circuit 60. The matching circuit 60 matches an input impedance of the input terminal Tin with an input impedance of the amplifier 61. The matching circuit 60 supplies a gate bias from a bias terminal Tg1 to the amplifier 61. The output of the amplifier 61 is connected to a node Nm via the matching circuit 62c. The matching circuit 62c matches an output impedance of the amplifier 61 with an impedance when the matching circuits 62a and 62b are viewed from the node Nm. The matching circuit 62c supplies a drain bias from a bias terminal Td1 to the amplifier 61. The output of the amplifier 61 is branched at the node Nm and connected to the amplifiers 63a and 63b via matching circuits 62a and 62b, respectively. The matching circuit 62a matches an impedance when the matching circuits 62a and 62b are viewed from the node Nm with an input impedance of the amplifier 63a. The matching circuit 62a supplies a gate bias from a bias terminal Tg2a to the amplifier 63a. The matching circuit 62b matches an impedance when the matching circuits 62a and 62b are viewed from the node Nm with an input impedance of the amplifier 63b. The matching circuit 62a supplies a gate bias from a bias terminal Tg2b to the amplifier 63b. The outputs of the amplifiers 63a and 63b are combined with each other via the matching circuits 64a and 64b, respectively, and connected to the output terminal Tout. The matching circuit 64a matches an output impedance of the amplifier 63a with an output impedance of the output terminal Tout. The matching circuit 64a supplies a drain bias from a bias terminal Td2 to the amplifiers 63a and 63b. The matching circuit 64b matches an output impedance of the amplifier 63b with the output impedance of the output terminal Tout.

Figure 13:
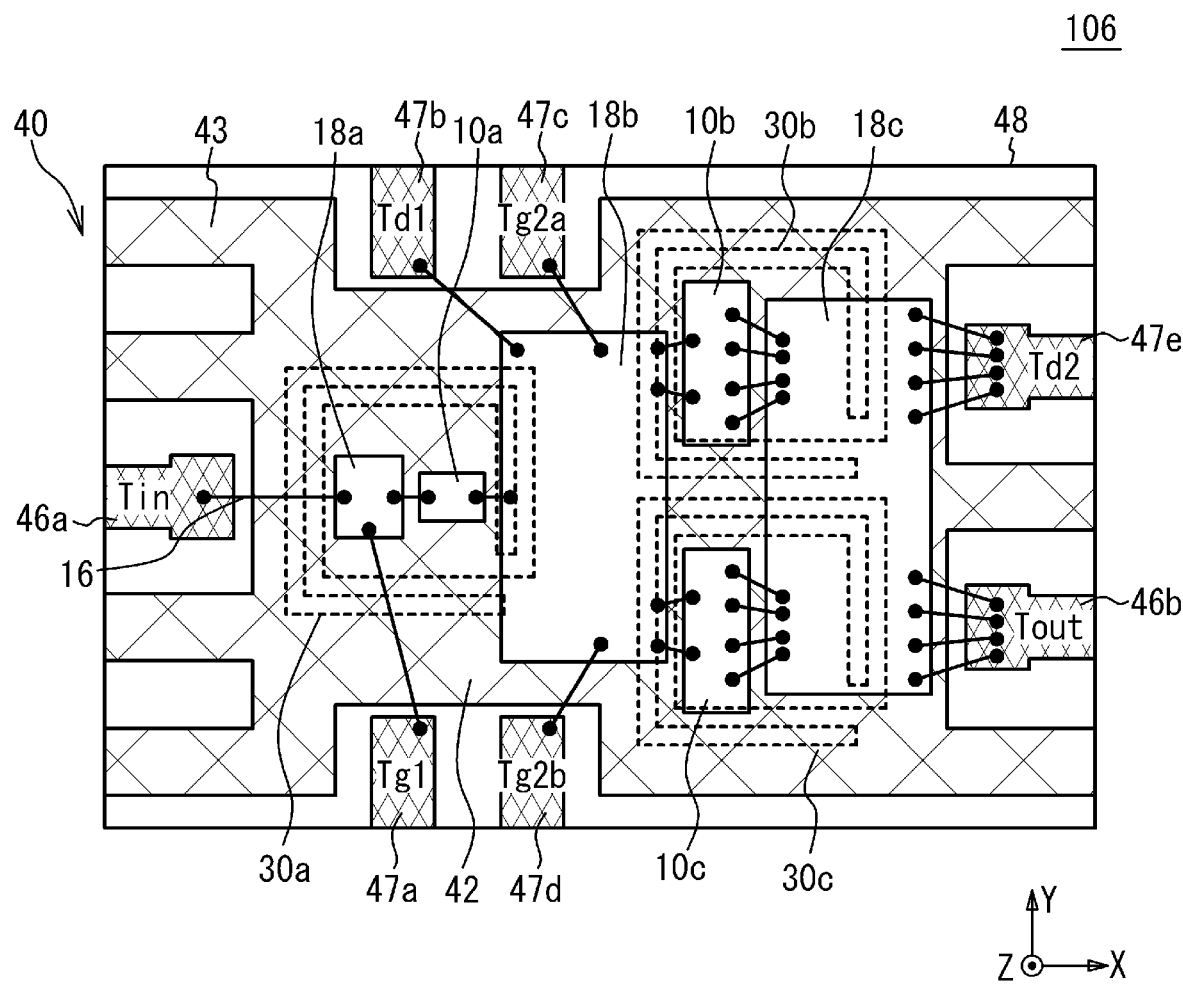
FIG. 13 is a plan view illustrating the high frequency device according to the second embodiment.

FIG. 13 is a plan view illustrating the high frequency device according to the second embodiment. In FIG. 13, the pattern 30 for resonator in the substrate 20 is illustrated by a broken line. As illustrated in FIG. 13, the lead frame 40 includes the base 42, the leads 46a and 46b, and leads 47a to 47e. The leads 46a and 46b are connected to the input terminal Tin and the output terminal Tout, respectively. The leads 47a to 47e are electrically connected to the bias terminals Tg1, Td1, Tg2a, Tg2b and Td2, respectively. The semiconductor chips 10a to 10c and the chips 18a to 18c are mounted on the base 42. The bonding wires 16 electrically connect the leads 46a and 46b and the leads 47a to 47e to the semiconductor chips 10a to 10c and the chips 18a to 18c, and electrically connect the semiconductor chips 10a to 10c to the chips 18a to 18c.

The patterns 30a to 30c for resonator are provided above the semiconductor chips 10a to 10b. As in the second embodiment, it is preferable that the patterns 30a to 30c for resonator are provided so as to overlap with all of the semiconductor chips 10a to 10b when viewed from above. Thereby, it is possible to suppress a part of the high frequency signals amplified by the semiconductor chips 10a to 10c from returning to the input sides of the semiconductor chips 10a to 10c. In the second embodiment, the plurality of semiconductor chips 10a and 10b are provided so as to overlap with the plurality of patterns 30a to 30c for resonator, respectively. However, one resonator may be provided so as to overlap with the plurality of semiconductor chips 10a to 10c, or the plurality of resonators may be provided so as to overlap with one of the semiconductor chips 10a to 10c. Other configurations are the same as those in the first embodiment, and the description thereof will be omitted. The matching circuits 60, 62a, 62b, 64a and 64b may be provided between the signal lines and the semiconductor chips 10a to 10c as in the second embodiment. Although a two-stage amplification device is used as an example of the high frequency power amplifier, a single-stage amplification device or a three-stage or higher amplification device may also be used.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A high frequency device comprising:
   a semiconductor chip including a semiconductor substrate, and an amplifier provided on a front surface of the semiconductor substrate and amplifying a high frequency signal;
   a first reference potential layer provided above the semiconductor chip in an upper direction perpendicular to the front surface of the semiconductor substrate, and provided so as to overlap with the semiconductor chip in a plan view from above, and to which a reference potential is supplied; and
   a resonator provided between the semiconductor chip and the first reference potential layer in the upper direction perpendicular to the front surface of the semiconductor substrate, wherein a resonance frequency of the resonator is included in an operating frequency band of the amplifier, and an impedance of the resonator becomes minimal at the resonance frequency.

2. The high frequency device as claimed in claim 1, wherein
   at least a part of the resonator overlaps with at least a part of the semiconductor chip when viewed from above.

3. The high frequency device as claimed in claim 1, further comprising:
   a substrate provided above the semiconductor chip and having a dielectric layer and a plurality of conductor layers that are laminated;
   wherein the plurality of conductor layers include the first reference potential layer, the resonator, and a signal line that transmits the high frequency signal input or output to the semiconductor chip.

4. The high frequency device as claimed in claim 1, wherein
   the resonator includes an electrode that forms a capacitance between the electrode and the first reference potential layer, and a line that has a first end connected to the electrode and a second end electrically connected to the first reference potential layer, surrounds the electrode, and forms an inductance.

5. The high frequency device as claimed in claim 1, further comprising:
   a second reference potential layer provided between the first reference potential layer and the resonator and to which a reference potential is supplied;
   wherein the resonator includes an electrode that forms a capacitance between the electrode and the second reference potential layer, and a line that has a first end connected to the electrode and a second end electrically connected to the second reference potential layer, surrounds the electrode, and forms an inductance.

6. The high frequency device as claimed in claim 1, wherein
   the resonator includes a distributed constant line having an electrical length longer than ⅛ and shorter than ⅜ of a wavelength of a signal at a center frequency of an operating frequency band of the amplifier, and having a first end connected to the reference potential and a second end being opened.

7. The high frequency device as claimed in claim 3, further comprising:
   a lead frame having a base portion on which the semiconductor chip is mounted and that is connected to the semiconductor chip at a back surface side facing the front surface of the semiconductor substrate, and a signal lead portion electrically connected to an electrode provided on the front surface of the semiconductor substrate;
   wherein the signal lead portion is bonded to the signal line.

8. The high frequency device as claimed in claim 3, further comprising:
   a bump provided on a front surface of the semiconductor chip and connecting the signal line to the semiconductor chip.

9. The high frequency device as claimed in claim 3, further comprising:
   a heat dissipation member provided below the semiconductor chip.

* * * * *